United States Patent
Kim et al.

(10) Patent No.: US 7,605,025 B2
(45) Date of Patent: Oct. 20, 2009

(54) METHODS OF FORMING MOSFETS USING CRYSTALLINE SACRIFICIAL STRUCTURES

(75) Inventors: Min-sang Kim, Seoul (KR);
Chang-woo Oh, Gyeonggi-do (KR);
Dong-won Kim, Gyeonggi-do (KR);
Kyoung-hwan Yeo, Seoul (KR);
Sung-min Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 625 days.

(21) Appl. No.: 11/050,557

(22) Filed: Feb. 3, 2005

(65) Prior Publication Data

US 2005/0176219 A1    Aug. 11, 2005

(30) Foreign Application Priority Data

Feb. 6, 2004    (KR) ............ 10-2004-0008052

(51) Int. Cl.
*H01L 21/00* (2006.01)
*H01L 21/76* (2006.01)

(52) U.S. Cl. .............. 438/151; 438/413; 438/422; 438/424

(58) Field of Classification Search .......... 438/149, 438/151, 411–412, 421–422, 424
See application file for complete search history.

(56) References Cited

U.S. PATENT DOCUMENTS

| | | | |
|---|---|---|---|
| 6,071,783 A | 6/2000 | Liang et al. | |
| 6,448,115 B1 * | 9/2002 | Bae | 438/151 |
| 6,649,979 B2 * | 11/2003 | Jang | 257/347 |
| 6,858,505 B2 | 2/2005 | Park | |
| 6,936,875 B2 * | 8/2005 | Sugii et al. | 257/288 |
| 6,964,911 B2 * | 11/2005 | Orlowski et al. | 438/400 |
| 7,033,868 B2 * | 4/2006 | Nakamura et al. | 438/149 |
| 7,091,072 B2 * | 8/2006 | Park et al. | 438/151 |
| 2002/0034841 A1 * | 3/2002 | Lee | 438/149 |
| 2002/0048896 A1 * | 4/2002 | Tseng | 438/424 |
| 2002/0072206 A1 * | 6/2002 | Chen et al. | 438/526 |
| 2003/0102499 A1 * | 6/2003 | Fujiwara | 257/288 |
| 2003/0173617 A1 * | 9/2003 | Sato et al. | 257/327 |
| 2004/0140520 A1 * | 7/2004 | Kim et al. | 257/509 |
| 2005/0098094 A1 * | 5/2005 | Oh et al. | 117/95 |
| 2006/0115941 A1 * | 6/2006 | Shin | 438/197 |
| 2006/0170011 A1 * | 8/2006 | Irisawa et al. | 257/250 |
| 2007/0072380 A1 * | 3/2007 | Wirbeleit et al. | 438/303 |

FOREIGN PATENT DOCUMENTS

| | | |
|---|---|---|
| JP | 04-249372 | 9/1992 |
| JP | 09-045904 | 2/1997 |
| KR | 1020000041698 | 7/2000 |
| KR | 1020000056248 | 9/2000 |

\* cited by examiner

*Primary Examiner*—M. Wilczewski
*Assistant Examiner*—Toniae M Thomas
(74) *Attorney, Agent, or Firm*—Myers Bigel Sibley & Sajovec, P.A.

(57) ABSTRACT

A Metal-Oxide-Semiconductor Field-Effect-Transistor (MOSFET) can be formed by growing an epitaxial semiconductor layer on an upper surface of a sacrificial crystalline structure and on a substrate to form a buried sacrificial structure. The buried sacrificial structure can be removed to form a void in place of the buried sacrificial structure and a device isolation layer can be formed in the void.

15 Claims, 10 Drawing Sheets

METHODS OF FORMING MOSFETS USING CRYSTALLINE SACRIFICIAL STRUCTURES

CROSS-REFERENCE TO RELATED APPLICATION

This U.S. non-provisional patent application claims priority under 35 U.S.C. § 119 to Korean Patent Application 2004-08052 filed on Feb. 6, 2004, the entire content of which is incorporated herein by reference.

FIELD OF THE INVENTION

The present invention relates to semiconductor devices and specifically to methods of forming Metal-Oxide-Semiconductor Field Effect Transistors (MOSFETS) and devices so formed.

BACKGROUND

As semiconductor devices have become more highly integrated, a channel length (i.e., the distance between a source region and a drain region of the MOS field effect transistor) may be reduced. The reduction of the channel length may cause short channel effects. Methods of forming source/drain regions including an LDD (lightly doped drain) structure have been proposed in order to reduce/prevent short channel effects. However, these methods may not be as effective when a line width of a gate electrode is less than 0.1 µm. Korean Laid-Open patent No. 2000-041698, Japanese patent No. H9-045904, Korea Laid-Open patent No. 2000-056248, discuss techniques for forming a buried insulation region under the channel region to suppress short channel effects.

FIG. 1 is a perspective view and FIG. 2 is a cross-sectional view illustrating a conventional MOSFET including a buried insulation region. Referring to FIG. 1, insulation patterns 20 are formed on a predetermined region of the semiconductor substrate 10. The insulation patterns 20 are formed in a region of the substrate that will be under a gate of the MOSFET, to help reduce a short channel effects.

An epitaxial layer 30 is formed on the semiconductor substrate 10 using epitaxial growth. The epitaxial layer 30 is formed to have a thickness thicker than that of the insulation pattern 20. Therefore, as shown in the drawing, the epitaxial layer 30 is also formed on the insulation pattern 20. After the epitaxial layer 30 and the semiconductor substrate 10 are sequentially patterned to form a trench to define an active region, a device isolation pattern 40 is formed in the trench.

The insulating pattern 20 is formed of an amorphous material, such as oxide and nitride, which causes the epitaxial layer 30 to be grown in separate portions (or individually) from the underlying substrate 10 around the insulating pattern 20. The separate portions of the epitaxial layer 30 meet above the insulating pattern 20 to form a discontinuous boundary 35 (or seam) in the epitaxial layer 30 in a region that is to be the channel region of the MOSFET.

Referring to FIG. 2, a gate insulation layer 50 and a gate pattern 60 are formed sequentially on the epitaxial layer 30. Source/drain regions 70 are formed in the epitaxial layer 30 on both sides of the gate pattern 60. The portion of the epitaxial layer 30 including the seam under the gate pattern 60 (i.e., between the source/drain regions) is used as the channel region of the MOSFET. The discontinuous boundary 35 in the epitaxial layer 30 may adversely affect the electrical characteristics of the MOSFET. In view of the above, the conventional techniques discussed above using the insulation pattern 20 may suppress short channel effects, but may also degrade electrical characteristics of the MOSFET.

SUMMARY

Embodiments according to the invention can provide methods of forming Metal-Oxide-Semiconductor Field-Effect-Transistors (MOSFETs) using crystalline sacrificial structures and MOSFETs so formed. Pursuant to these embodiments, a method of forming a MOSFET includes growing an epitaxial semiconductor layer on an upper surface of a sacrificial crystalline structure and on a substrate to form a buried sacrificial structure. The buried sacrificial structure is removed to form a void in place of the buried sacrificial structure and a device isolation layer is formed in the void.

In some embodiments according to the invention, forming a device isolation layer in the void includes forming the device isolation layer beneath a central portion of a channel region in the MOSFET. In some embodiments according to the invention, forming a device isolation layer in the void includes forming the device isolation layer beneath a central portion of a channel region in the MOSFET and extending into source/drain regions at opposing ends of the channel.

In some embodiments according to the invention, forming a device isolation layer in the void includes forming the device isolation layer adjacent to a source region and/or a drain region and avoiding forming the device isolation layer beneath a central portion of a channel region in the MOSFET.

In some embodiments according to the invention, a method of forming a MOSFET includes forming a first recess in a region of a semiconductor substrate having a crystalline structure. A sacrificial structure having the crystalline structure is formed in the recess. An epitaxial semiconductor layer is formed on the sacrificial structure and on the semiconductor substrate. The epitaxial semiconductor layer and the semiconductor substrate are patterned to form a second recess to expose a lateral sidewall surface of the sacrificial structure. The sacrificial structure is removed via the exposed lateral sidewall surface to form a void in the substrate in place of the sacrificial structure and a device isolation layer is formed in the void.

In some embodiments according to the invention, forming a first recess includes forming a first mask pattern on the semiconductor substrate to define the first recess using photolithography, a photoresist reflow process, a spacer masking process, and/or a chemical adhesion process. The semiconductor substrate is etched using the first mask pattern as an etch mask. In some embodiments according to the invention, forming a sacrificial structure includes epitaxially growing the sacrificial structure using the first mask pattern as an epitaxial mask to prevent epi-growth beneath the mask.

In some embodiments according to the invention, the sacrificial pattern includes a crystalline material having an etching selectivity with respect to the semiconductor substrate and the epitaxial semiconductor layer. In some embodiments according to the invention, the semiconductor substrate and the epitaxial semiconductor layer include silicon and the sacrificial structure comprises silicon germanium.

In some embodiments according to the invention, forming an epitaxial semiconductor layer includes epitaxially growing a silicon layer having a crystalline structure equivalent to that of the substrate on the substrate and on the sacrificial structure. In some embodiments according to the invention, patterning the epitaxial semiconductor layer and the semiconductor substrate to form a second recess further include forming a second mask pattern on the semiconductor substrate including the epitaxial semiconductor layer. The epitaxial semiconductor layer and the semiconductor substrate are etched using the second mask pattern as an etch mask, wherein the second mask pattern crosses over the sacrificial structure.

In some embodiments according to the invention, a gate insulation layer is formed on the epitaxial semiconductor layer above the device isolation layer. A gate pattern is formed on the gate insulation layer to cross over a central portion of the epitaxial semiconductor layer and source/drain regions are in the epitaxial semiconductor layer on both sides of the gate pattern. In some embodiments according to the invention, the first recess is formed to contact a lateral surface of the source/drain region.

In some embodiments according to the invention, a method of forming a MOSFET includes forming a first mask pattern in a predetermined region of a semiconductor substrate having a crystalline structure. A first recess is formed in the semiconductor substrate using the first mask pattern as an etch mask. A crystalline sacrificial structure is epitaxially grown in the first recess using the first mask pattern to prevent epitaxial growth beneath the first mask pattern. The first mask pattern is removed to expose an upper surface of the semiconductor substrate. A semiconductor layer is epitaxially grown on an upper surface of the sacrificial structure and the semiconductor substrate. The epitaxial semiconductor layer and the semiconductor substrate are patterned to form a second trench exposing a lateral surface of the sacrificial structure. The exposed sacrificial structure is removed to form a void in the first recess and a device isolation layer is formed in the void. A gate insulation layer is formed on the epitaxial semiconductor layer. A gate pattern is formed on the gate insulation layer to cross over a central portion of the epitaxial semiconductor layer. Source/drain regions are formed in the epitaxial semiconductor layer on both sides of the gate pattern.

In some embodiments according to the invention, a submicron channel length MOSFET includes a seamless epitaxial channel region in a substrate of the MOSFET and a buried device isolation layer beneath the seamless epitaxial channel region. In some embodiments according to the invention, a buried device isolation layer includes the buried device isolation layer beneath a central portion of the seamless epitaxial channel and absent from sidewalls of source/drain regions of the MOSFET.

In some embodiments according to the invention, a buried device isolation layer includes the buried device isolation layer beneath a side portion of the seamless epitaxial channel including on sidewalls of source/drain regions of the MOSFET. In some embodiments according to the invention, a buried device isolation layer includes the buried device isolation layer beneath an entire length of the seamless epitaxial channel and including on sidewalls of source/drain regions of the MOSFET.

In some embodiments according to the invention, an upper surface of the buried device isolation layer is buried beneath a surface of the seamless epitaxial channel by an amount sufficient to avoid a floating body effect. In some embodiments according to the invention, a liner layer surrounding the device isolation layer includes a silicon nitride layer, a silicon oxynitride layer, and/or a silicon oxide layer. In some embodiments according to the invention, a thermal oxidation layer surrounds the liner layer.

BRIEF DESCRIPTION OF THE DRAWINGS

FIGS. 4A through 9A are cross-sectional views taken along a dotted line I-I in FIG. 3.

FIGS. 4B through 9B are cross-sectional views taken along a dotted line II-II in FIG. 3.

DESCRIPTION EMBODIMENTS ACCORDING TO THE INVENTION

Figure 1:
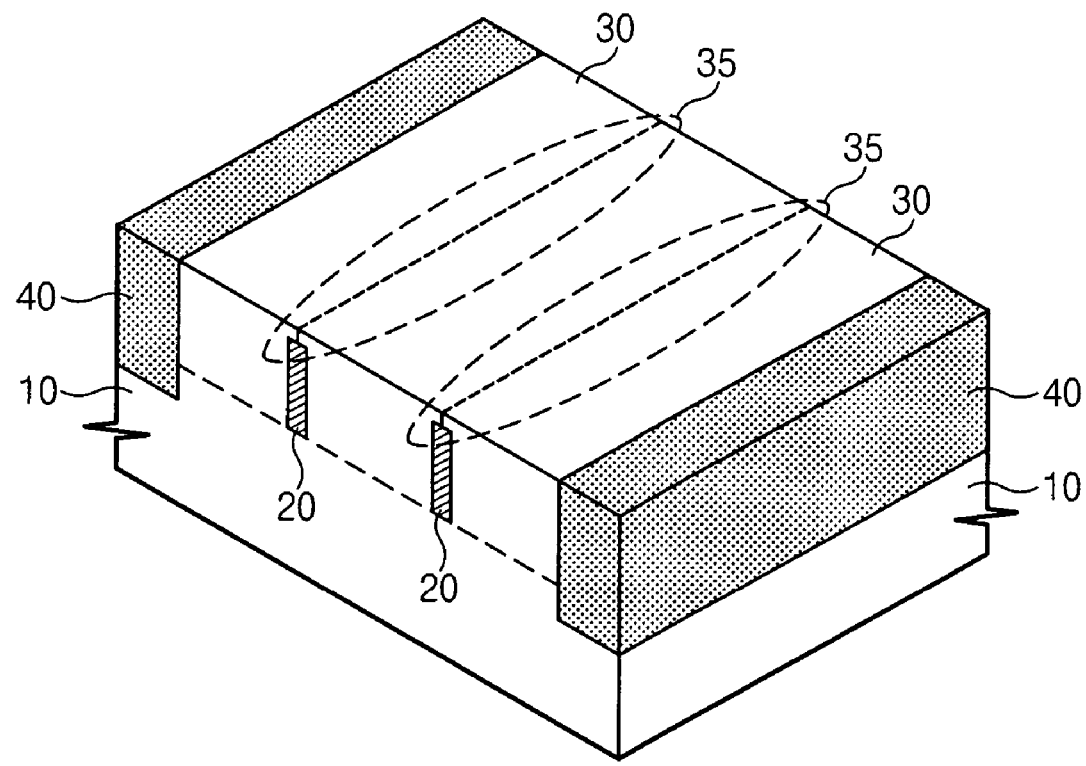
FIG. 1 is a perspective view for explaining a method of fabricating a MOS field effect transistor in accordance with a prior art.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As disclosed herein in further detail, in some embodiments according to the invention, an epitaxial semiconductor layer is grown on an upper surface of a sacrificial crystalline structure and on a substrate to form a buried sacrificial structure. The buried sacrificial structure is removed to form a void in place of the buried sacrificial structure and a device isolation layer is formed in the void. Forming the buried sacrificial structure of a crystalline material may promote the formation of the epitaxial semiconductor layer from the sacrificial crystalline structure, which may help avoid the formation of a seam in the epitaxial layer above the buried sacrificial structure in a portion of the substrate which provides the channel region of the MOSFET. Avoiding the formation of the seam, may promote the growth of the epitaxial semiconductor layer in the channel having better electrical properties, particularly in devices sized so that short channel effects may be an issue.

Figure 3:
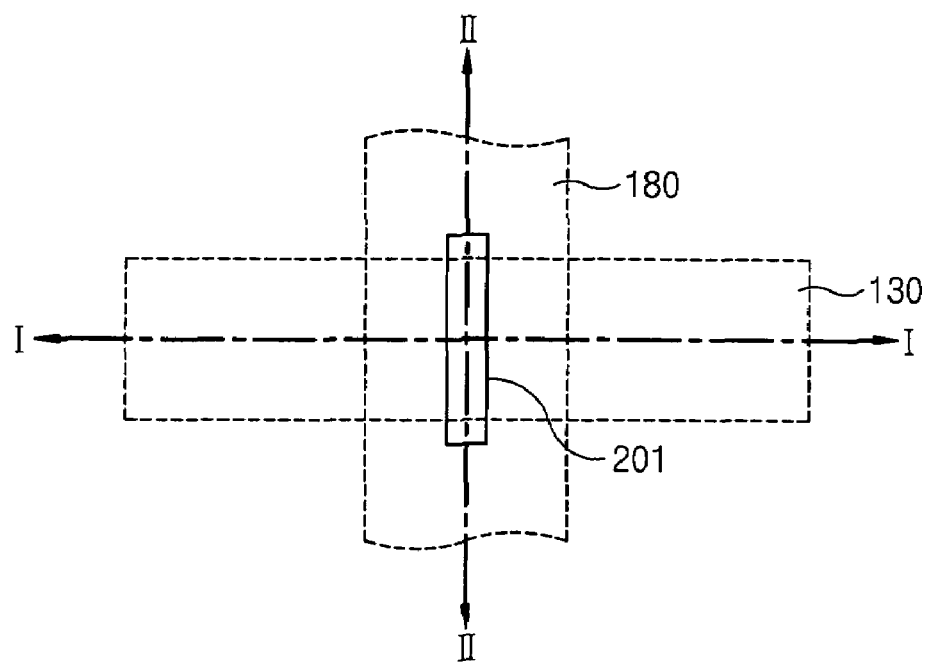
FIG. 3 is a top plane view of a MOS field effect transistor in accordance with one exemplary embodiment of the present invention.

FIG. 3 is a top plane view of a MOS field effect transistor in accordance with some embodiments of the present invention, FIGS. 4A through 9A are cross-sectional views taken along a dotted line I-I in FIG. 3, and FIGS. 4B through 9B are cross-sectional views taken along a dotted line II-II in FIG. 3.

Figure 4A:
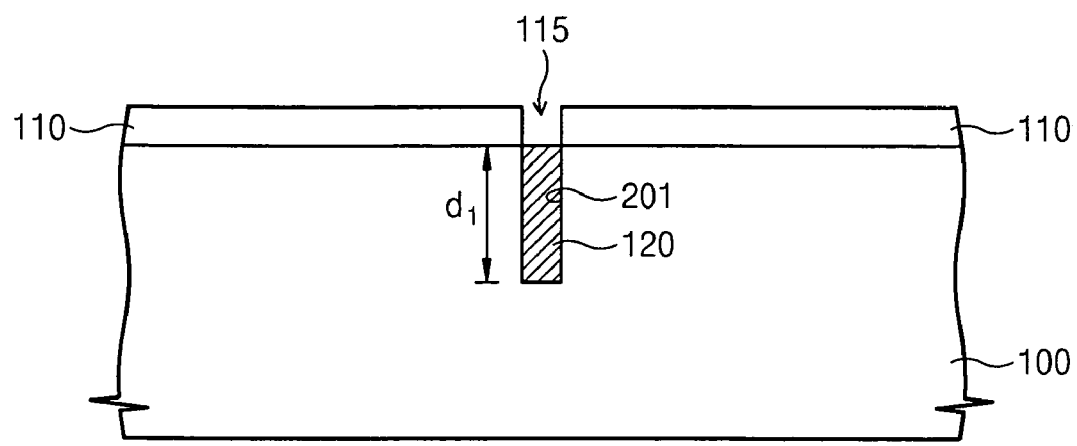
Figure 4B:
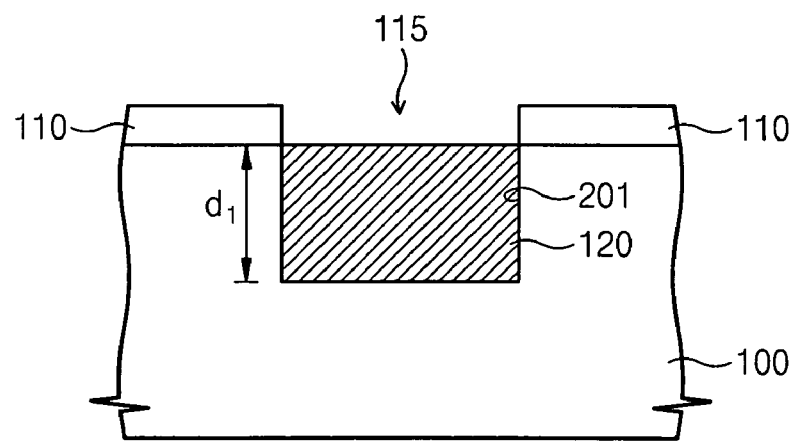

Referring to FIGS. 3, 4A through 4B, a first mask layer is formed on a semiconductor substrate 100. In this case, the semiconductor substrate 100 is formed of a semiconductor having a crystalline structure (e.g., a polysilicon structure), and the first mask layer may be formed of a silicon oxide layer and a silicon nitride layer that are sequentially stacked. However, other kinds of materials may be used as the first semiconductor substrate 100 and the first mask layer.

The first mask layer is patterned to form a first mask pattern 110 having an opening 115 exposing a predetermined region of the semiconductor substrate 100. Using the first mask pattern 110 as an etch mask, the exposed semiconductor substrate 100 is etched to form a first trench or recess 201 (i.e., a buried insulation region) having a first depth $d_1$. In some embodiments according to the invention, the first trench 201 has a line width smaller than that of a gate pattern (of which line width is smallest in a semiconductor device). Therefore, the opening 115 of the first mask pattern 110, which defines the first trench 201, should be formed to also have a micro width. The first mask pattern 110 may be formed using any etch/lithography process, a photoresist reflow process, a spacer masking process, and/or a chemical adhesion process.

A sacrificial pattern (or sacrificial crystalline structure) 120 is formed to fill the first trench 210. According to the present invention, the sacrificial pattern 120 has a crystalline structure and formed of a material having etch selectivity with respect to the semiconductor substrate 100. That is, the sacrificial pattern 120 is formed of a material having etch rate faster than that of the semiconductor substrate 100 in a specific etch recipe in order to reduce etch of the semiconductor substrate 100. According to some embodiments of the present invention, the sacrificial pattern 120 may be a silicon germanium pattern formed by epitaxial growth. During formation of the sacrificial pattern 120, the first mask pattern 110 is used as an epitaxial prevent mask (or mask to prevent epitaxial growth from the portion of the substrate 100 which is covered by the mask). That is, the first mask pattern 110 covers a top surface of the semiconductor substrate 100 except for the first trench 201 so as to form the sacrificial pattern 120 only inside the first trench 201.

Figure 5A:
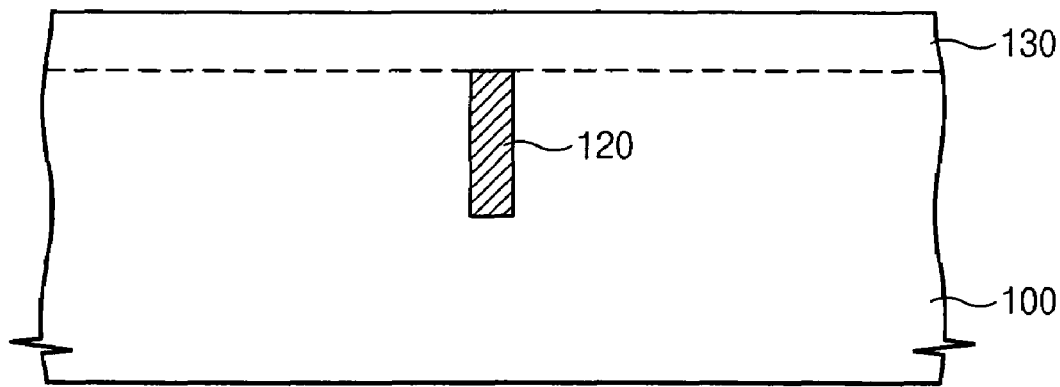
Figure 5B:
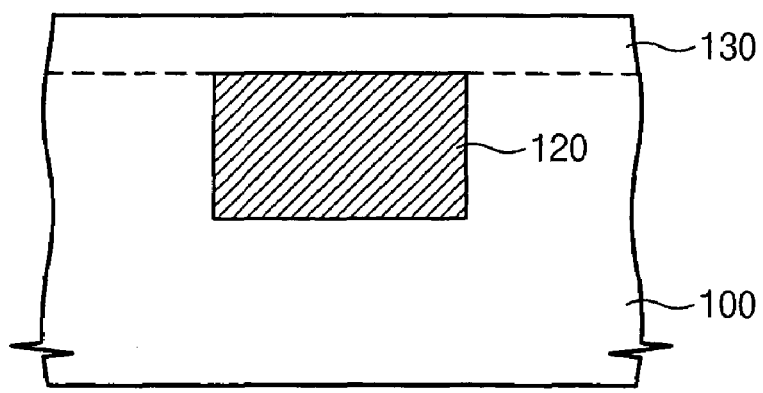

Referring to FIGS. 3, 5A through 5B, the first mask pattern 110 is removed. Therefore, upper surfaces of the semiconductor substrate 100 and the sacrificial pattern 120 are exposed. An epitaxial semiconductor layer 130 is formed on the exposed semiconductor substrate 100 and the sacrificial pattern 120 to provide the sacrificial pattern 120 as a buried sacrificial structure. In some embodiments according to the invention, the epitaxial semiconductor layer 130 is formed of a semiconductor having a crystalline structure and may be formed of polysilicon identical to the semiconductor substrate 100.

As fully described above, the sacrificial pattern 120 may be formed of semiconductor material having a crystalline structure. Therefore, the epitaxial semiconductor layer 130 may be grown from the upper surface of the buried sacrificial structure as well as from the adjacent upper surface of the substrate 100 to provide a seamless single crystalline structure (without a discontinuous boundary) in the epitaxial semiconductor layer 130. As a result, the epitaxial semiconductor layer 130 may be used as a channel region of the MOSFET. In some embodiments according to the invention, a thickness of the epitaxial semiconductor layer 130 may be determined considering a thickness of the channel region, a depth of the source/drain regions, recess of a subsequent process, etc.

Figure 6A:
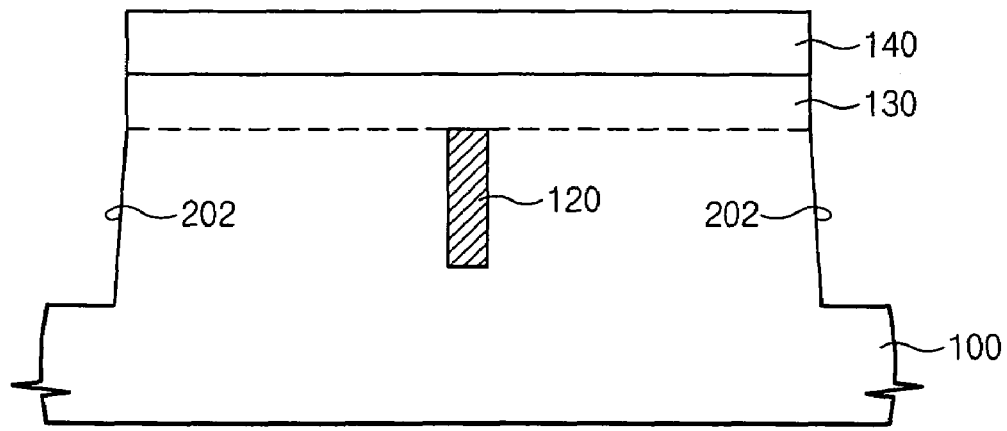
Figure 6B:
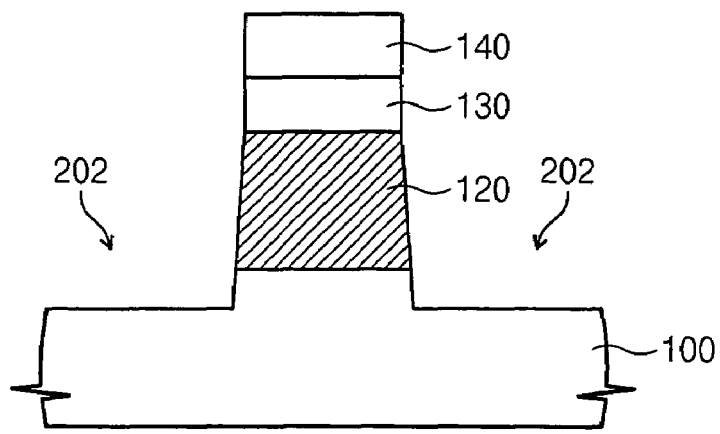

Referring to FIGS. 3, 6A through 6B, a second mask pattern 140 is formed on the epitaxial semiconductor layer 130 to cross over the sacrificial pattern 120. Using the second mask pattern 140 as an etch mask, the epitaxial semiconductor layer 130 and the semiconductor substrate 100 are successively etched. Therefore, a second trench (or recess) 202 is formed around the second mask pattern 140 to define an active region.

Considering a planar arrangement of the second mask pattern 140 and the sacrificial pattern 120, the sacrificial pattern 120 is disposed under a central portion of the second mask pattern 140, and both edges thereof are exposed at each side of the second mask pattern 140 (with reference to FIG. 3). Thus, the sacrificial pattern 120 is disposed in a central portion of the active region, and both edges thereof are exposed by the second trench 202 (with reference to FIG. 6B).

The second mask pattern 140 may be formed of a silicon oxide layer, a silicon nitride layer, and/or a silicon oxynitride layer. In some embodiments according to the invention, the second trench 202 may be formed using an anisotropic etch having etch selectivity with respect to the second mask pattern 140.

Figure 2:
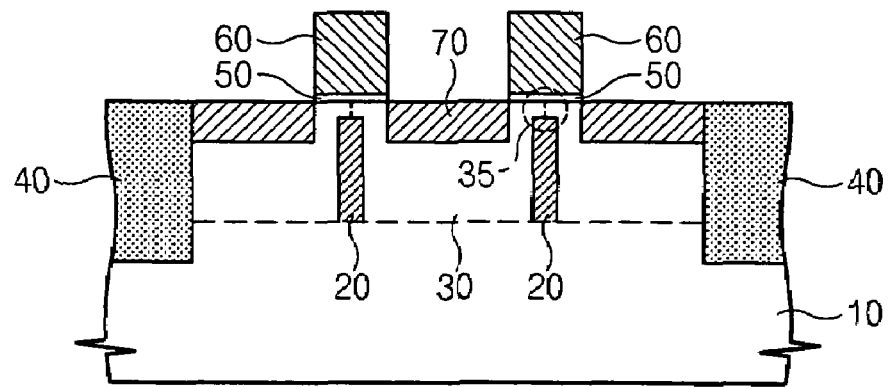
FIG. 2 is a cross-sectional view for explaining a method of fabricating a MOS field effect transistor in accordance with a prior art.
Figure 7A:
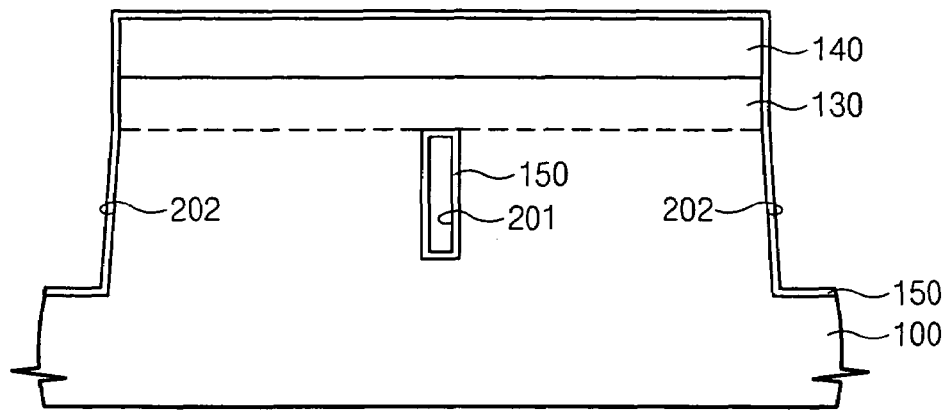
Figure 7B:
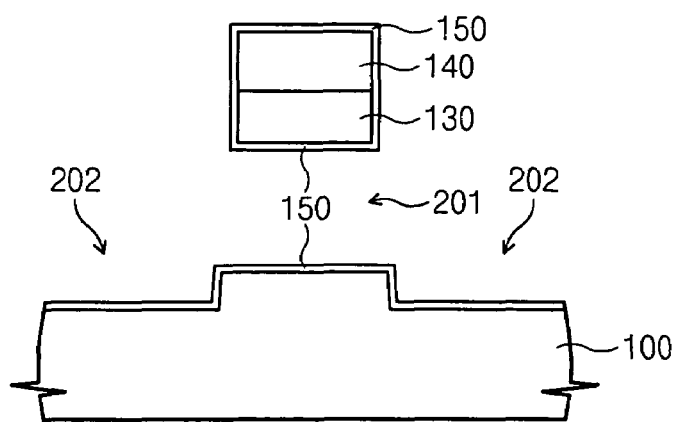

Referring to FIGS. 2, 7A through 7B, the exposed sacrificial pattern 120 is removed by using an etchant recipe with a selectivity with respect to the semiconductor substrate 100 and the epitaxial semiconductor layer 130. In some embodiments according to the invention, the sacrificial pattern 120 is removed using an isotropic etch and preferably an etch recipe capable of etching silicon germanium faster than silicon. Therefore, both inner sidewalls of the second trench 202 and the first trench 201 are exposed (with reference to FIG. 7B). Furthermore, removal of the exposed sacrificial pattern 120 forms a void in the substrate in place of the exposed sacrificial pattern 120 in the first trench 201.

A liner 150 may be formed on an entire surface of the semiconductor substrate that surrounds the sacrificial pattern 120. The liner 150 conformally covers the inner sidewalls of the first and second trenches 201 and 202 and the exposed surface of the second mask pattern 140. In some embodiments according to the invention, the liner 150 is a silicon nitride layer, a silicon oxynitride layer, and/or a silicon oxide layer. In some embodiments according to the invention, before forming the liner 150, a thermal oxidation process may be performed to form a thermal oxide layer (not shown) on the inner sidewalls of the first and second trenches 201 and 202. The thermal oxide layer may repair etch damage occurring during the formation of the first and second trenches 210 and 202. The liner 150 may reduce/prevent pollutants from penetrating into the active region, especially into the epitaxial semiconductor layer 130.

Figure 8A:
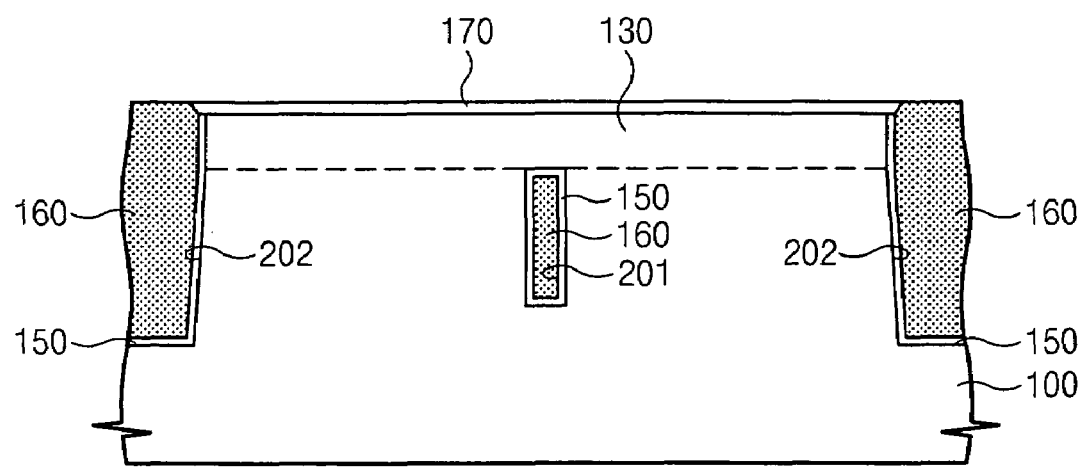
Figure 8B:
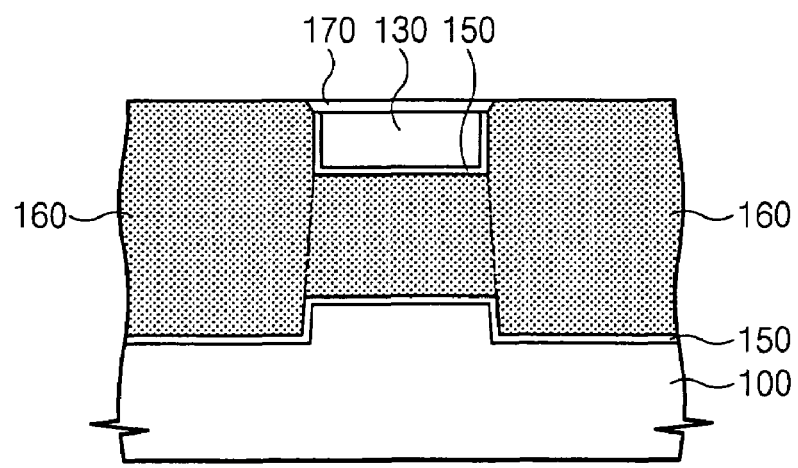

Referring to FIGS. 3, 8A through 8B, a device isolation layer is formed on the liner 150. The device isolation layer is formed of a silicon oxide layer, and may be formed of MTO and HDP oxide layers that are sequentially stacked. Other materials may also be used to form the device isolation layer.

In some embodiments according to the invention, the device isolation layer is formed to fill the first and second trenches 201 and 202. In some embodiments according to the invention, the first trench 201 is not filled with the device isolation layer, where the trench 201 is under a low pressure, nearly a vacuum, or filled with gases such as nitrogen or helium.

The device isolation layer is etched to form a device isolation pattern 160 filling the second trench 202. The formation of the device isolation pattern 160 includes planarizingly etching the second isolation layer until the second mask pattern 140 is exposed. The planarizing may be carried out using a chemical-mechanical polishing (CMP).

The exposed second mask pattern 140 is removed to expose a top surface of the epitaxial semiconductor layer 130. A gate insulating layer 170 is formed on a top surface of the exposed epitaxial semiconductor layer 130. The second mask pattern 140 can be removed using an etch recipe capable of etching the silicon nitride layer selectively, minimizing etching of the silicon and silicon oxide layer. In some embodiments according to the invention, the etch recipe is an isotropic wet etch using phosphoric acid. In some embodiments according to the invention, the gate insulating layer 170 is a silicon oxide layer formed through a thermal oxidation process.

Figure 9A:
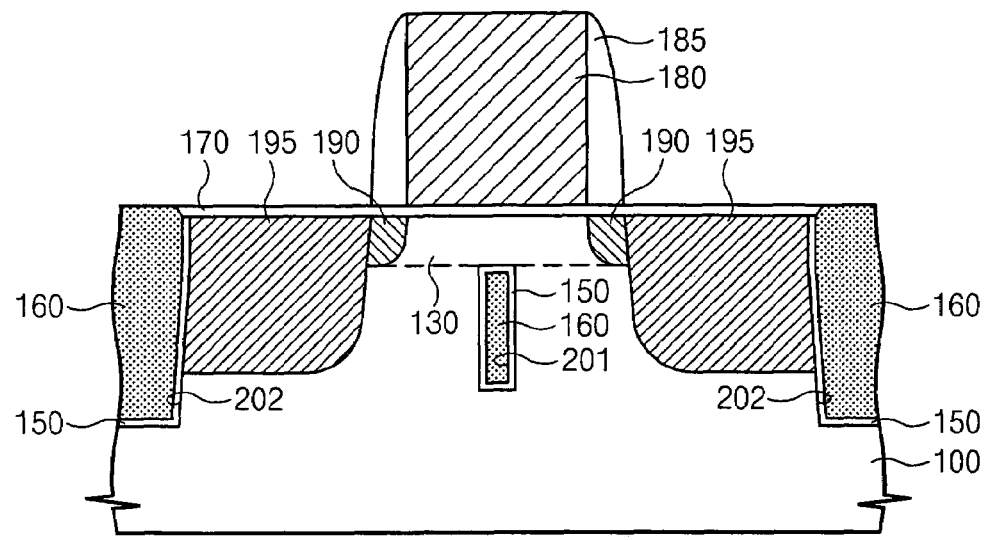
Figure 9B:
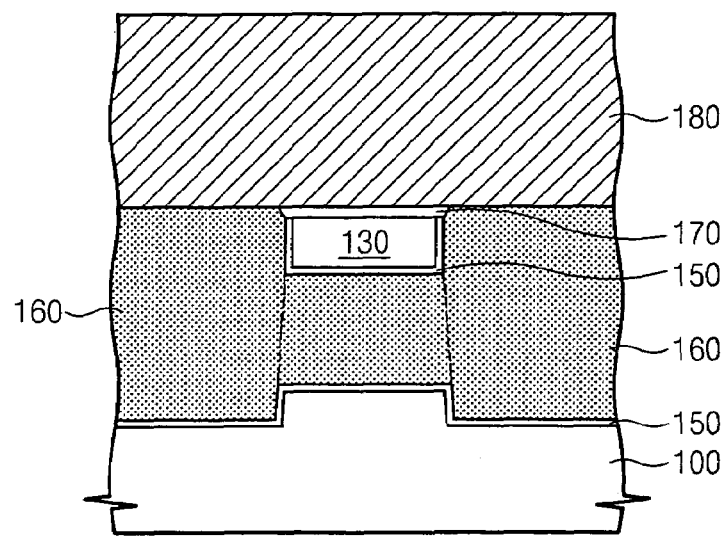

Referring to FIGS. 3, and 9A through 9B, a gate pattern 180 is formed on the gate insulating layer 170 to cross over the active region and the first trench 201. A low concentration ion implantation process is performed using the gate pattern 180 as a mask to form lightly doped regions 190 in the active region at both sides of the gate pattern 180. Gate spacers 185 are formed on a sidewall(s) of the gate pattern 180. A high concentration ion implantation is performed using the gate pattern 180 and the gate spacer 185 as a mask to form heavily doped regions 195 in the active region on both sides of the gate spacer 185.

The heavily doped region 195 and the lightly doped region 190 are disposed overlap each other and form a lightly doped drain (LDD) region in the substrate 100. The LDD regions formed at both sides of the gate pattern 180 serve as source/drain regions of the MOSFET.

Figure 10:
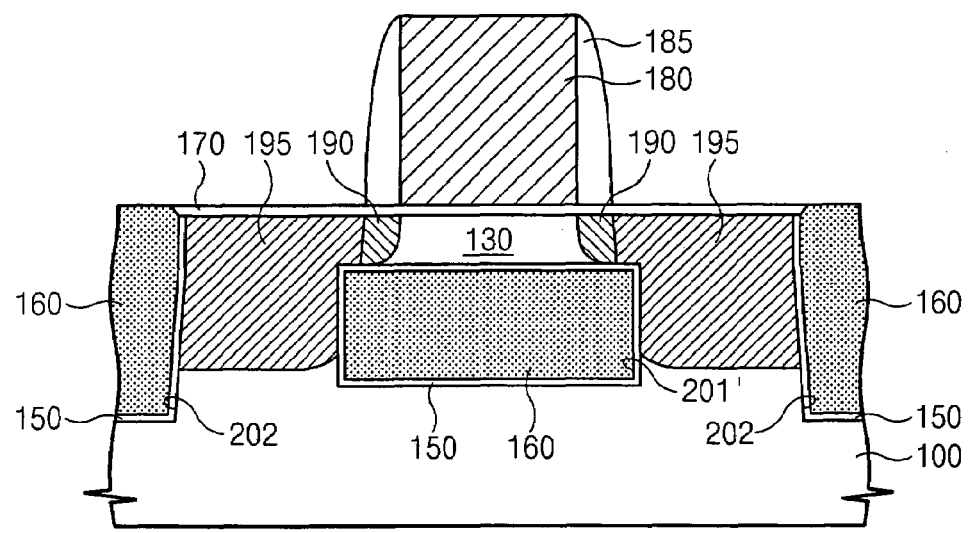
FIG. 10 is a cross-sectional view of a MOS field effect transistor in accordance with another exemplary embodiment of the present invention.
Figure 11:
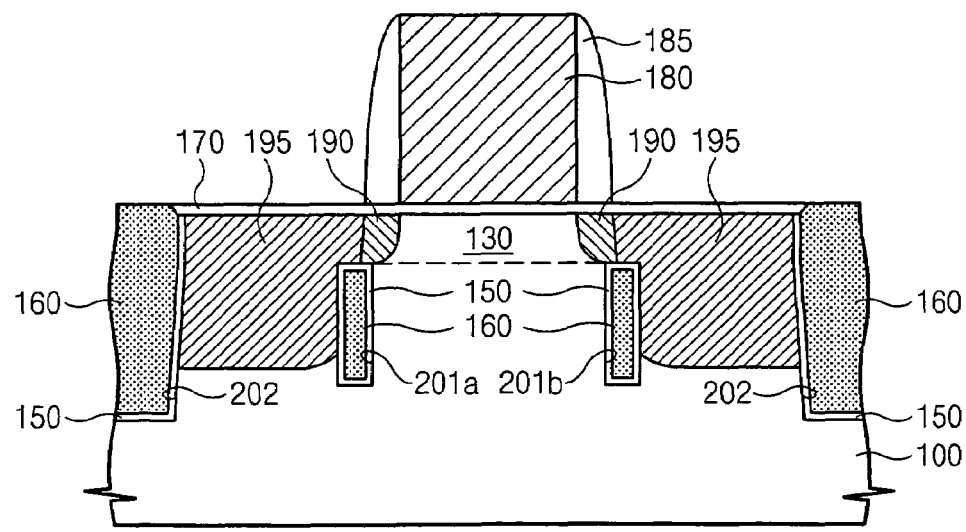
FIG. 11 is a cross-sectional view of a MOS field effect transistor in accordance with still another exemplary embodiment of the present invention.

FIGS. 10 and 11 are cross-sectional views illustrating MOSFETS formed according to some embodiments of the invention. It will be understood that the embodiments according to the invention illustrated by FIGS. 10 and 11 include structures which are analogous to those disclosed above in reference to FIGS. 3-9B.

Referring to FIG. 10, the first trench 201' is formed to insulate the channel region and the semiconductor substrate 100 electrically. That is, edges of the first trench (or recess) 201' are formed to lateral surfaces of the source region and the drain region. In other words, the first trench 201' extends beneath a central portion of the channel region and extends into the source/drain regions at opposing ends of the channel. As a result, the first trench 201' has a line width that is the same as or larger than that of the gate pattern 180. Therefore, the first mask pattern 110 may be formed easily because the opening 115 in FIGS. 4A and 4B may not be required.

In addition, according to some embodiments of the invention, a surface area of the sacrificial pattern 120 exposed by the second trench 202 becomes wide, such that the step of removing the sacrificial pattern 120 in FIGS. 7A and 7B may be easily performed. After the sacrificial pattern 120 is removed, the first trench 201' may be filled with the device isolation pattern 160.

In some embodiments according to the invention, the channel region is surrounded by the source/drain regions and the second trench 202. Moreover, a thickness of the channel region may be controlled using the epitaxial growth technology so that the channel region is depleted sufficiently and minority charges are not collected on a lower portion of the channel region. As a result, the floating body effect can be reduced/prevented in contrast to an SOI wafer arrangement. Furthermore, the source/drain regions extend into both the epitaxial semiconductor layer 130 and into the underlying semiconductor substrate 100 (so that the source/drain regions may be formed relatively deep compared to an SOI arrangement) to prevent/reduce an unacceptable increase in resistance.

Referring to FIG. 11, the first trenches 201a and 201b may be formed in one cell so as to prevent the floating body effect. In other words, the two first trenches 201a and 201b can be formed on the region where the gate pattern 180 cross over the active region. One of the first trenches 201a is formed to adjoin a lateral surface of the source region and the other of the first trenches 201b is formed to adjoin a lateral surface of the drain region. Moreover, the first trench 201 is not formed beneath a central portion of the channel.

The channel region is electrically connected to the substrate bias through the semiconductor substrate 100 beneath the central portion of the channel between the trenches 201a and 201b. As a result, the floating body effect can be prevented/reduced.

In the exemplary embodiments in FIGS. 10 and 11, a contact area of a PN junction of the source/drain regions and the semiconductor substrate 100 may be reduced. Therefore, a leakage current at the PN junction can be reduced in some embodiments according to the invention.

Figure 12:
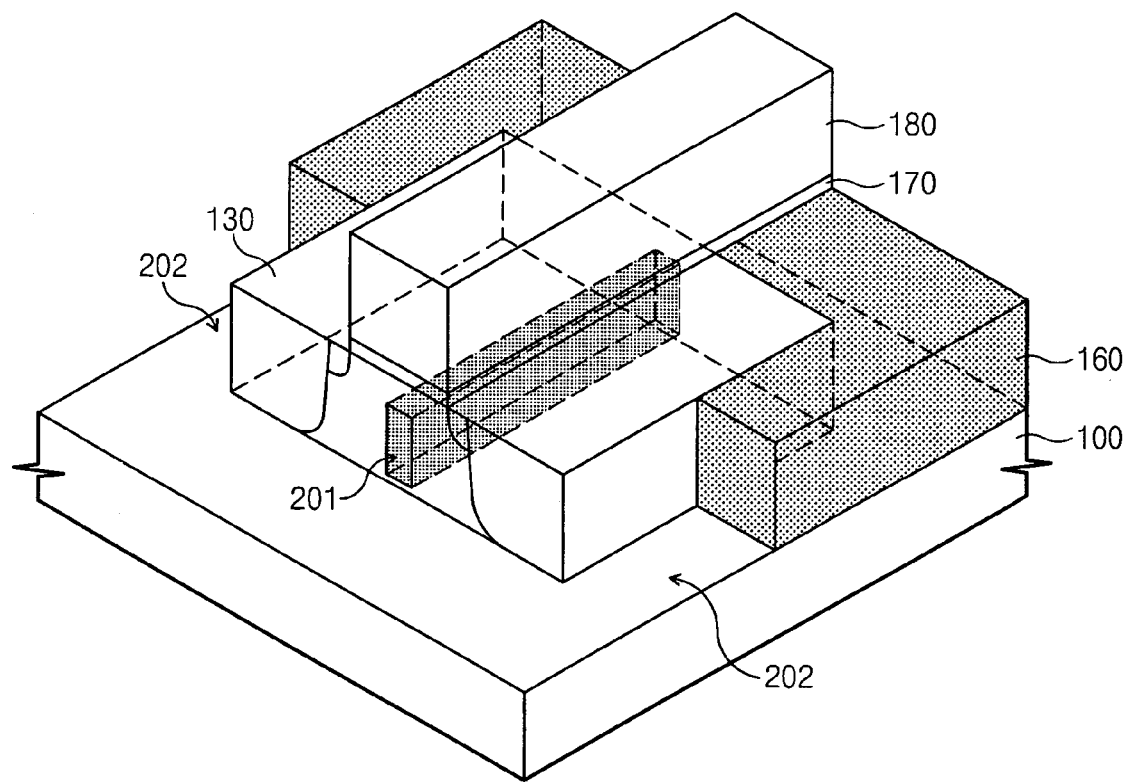
FIG. 12 is a perspective view of a MOS field effect transistor in accordance with one exemplary embodiment of the present invention.

FIG. 12 is a schematic cross-sectional view of a MOS field effect transistor in accordance with some embodiments of the invention. FIGS. 9A and 9B are cross-sectional views of a MOSFET corresponding to embodiments illustrated by FIG. 12. Referring to FIGS. 9A, 9B, and 12, a device isolation pattern 160 is disposed in a predetermined region of a semiconductor substrate 100 having a crystalline structure. An epitaxial semiconductor layer 130 is disposed on the semiconductor substrate 100 surrounded by the device isolation pattern 160. As a result, the device isolation pattern 160 surrounds the epitaxial semiconductor layer 130 and the semiconductor substrate 100 under the same. The region surrounded by the device isolation pattern 160 is defined as an active region.

The epitaxial semiconductor layer 130 may be formed of semiconductor having a crystalline structure such as the material of the semiconductor substrate 100. In some embodiments according to the invention, the semiconductor substrate 100 and the epitaxial semiconductor layer 130 are polysilicon. Moreover, the epitaxial semiconductor layer 130 comprises a "seamless" epitaxial channel region beneath the gate electrode in a central region of the channel. It will be understood that the term "seamless" includes epitaxial channel regions having a crystalline structure that is grown on an underlying crystalline sacrificial structure. Therefore, the epitaxial semiconductor layer 130 may be used as a channel of the transistor. In addition, the epitaxial semiconductor layer 130 is epitaxially grown from the semiconductor substrate 100, such that the two layers form a continuous single crystalline structure silicon.

A buried insulation region 201 is disposed under the epitaxial semiconductor layer 130. The buried insulation region 201 penetrates the semiconductor substrate 100 constituting the active region in parallel to be connected to the device isolation pattern 160. The buried insulation region 201 may be filled with the material of the device isolation pattern 160, under a low pressure of nearly vacuum, or filled with nitrogen or helium gases. A liner 150 or a thermal oxide layer may be interposed between the device isolation pattern 160 and the semiconductor substrate 100 and between the device isolation pattern 160 and the epitaxial semiconductor layer 130. The liner 150 and the thermal oxide layer may be formed on inner sidewalls of the buried insulation regions 201.

A gate pattern 180 crossing over the active region is disposed on the device isolation patter 160. Preferably, the gate pattern 180 is disposed on the buried insulation region 201. The epitaxial semiconductor layer 130 is interposed between the gate pattern 180 and the buried insulation region 201. Moreover a gate insulation layer 170 is disposed between the gate pattern and the epitaxial semiconductor layer 130.

Source regions 190 and 195 and drain regions 190 and 195 are disposed in the active region at both sides of the gate pattern 180. The channel region and the buried insulation region 201 are interposed between the source regions 190 and 195 and the drain regions 190 and 195. Therefore, the short channel effect can be decreased by the buried insulation region 201 that insulates the source region and the drain region electrically.

In still another exemplary embodiment of the present invention, the buried insulation region 201 may be disposed to adjoin lateral sidewalls of the source and drain regions. The electrical resistance of the source/drain regions can be reduced as illustrated in FIGS. 10 and 11, and the leakage current of the PN junction may be decreased. Two buried insulation region 201 may be disposed in each one cell and the above floating body effect can be minimized.

According to some embodiments of the present invention, an epitaxial semiconductor layer is formed on a sacrificial pattern and a semiconductor substrate that have a crystalline structure via epitaxial growth. Therefore, the epitaxial semiconductor layer used as a channel region is formed to have a crystalline structure without a discontinuous boundary surface (i.e., seamless).

In some embodiments according to the invention, a gate pattern of the present invention is disposed on a first trench or a buried insulation region where the sacrificial pattern is replaced. As a result, the buried insulation region is disposed between the source and drain regions as an insulation structural material.

In some embodiments according to the invention, the buried insulation region may be formed to contact lateral surfaces of the source and drain regions. An area where the source/drain regions contact the substrate is decreased, such that the leakage current generated at the source/drain regions can be reduced.

Since the source/drain regions may be formed deep, the source/drain may have sufficiently low resistance and the MOSFET can be fabricated to suppress disadvantages (e.g., floating body effect) but maintain advantages of the SOI substrate even if a structure and a disposition of the buried insulation region are varied.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming a Metal-Oxide-Semiconductor Field-Effect-Transistor (MOSFET) comprising:
forming a recess in an upper surface of a substrate;
forming a sacrificial crystalline structure filling the recess;
growing an epitaxial semiconductor layer on an upper surface of the sacrificial crystalline structure and on the substrate to form a buried sacrificial structure;
removing the buried sacrificial structure to form a void in place of the buried sacrificial structure; and
forming a device isolation layer in the void, wherein the epitaxial semiconductor layer and the substrate contact each other around the void to suppress a floating body effect and an upper surface of the buried sacrificial structure is above a lower surface of source/drain regions formed in the substrate.

2. A method according to claim 1 wherein forming a device isolation layer in the void comprises forming the device isolation layer beneath a central portion of a channel region in the MOSFET.

3. A method according to claim 1 wherein forming a device isolation layer in the void comprises forming the device isolation layer beneath a central portion of a channel region in the MOSFET and extending into the source/drain regions at opposing ends of the channel.

4. A method according to claim 1 wherein forming a device isolation layer in the void comprises:
forming the device isolation layer adjacent to a source region and/or a drain region; and
avoiding forming the device isolation layer beneath a central portion of a channel region in the MOSFET.

5. A method of forming a MOSFET, comprising:
forming a first recess in a region of a semiconductor substrate having a crystalline structure;
forming a sacrificial structure having the crystalline structure in the recess;
forming an epitaxial semiconductor layer on the sacrificial structure and on the semiconductor substrate;
patterning the epitaxial semiconductor layer and the semiconductor substrate to form a second recess to expose a lateral sidewall surface of the sacrificial structure;
removing the sacrificial structure via the exposed lateral sidewall surface to form a void in the substrate in place of the sacrificial structure; and
forming a device isolation layer in the void.

6. A method according to claim 5 wherein forming a first recess comprises:
forming a first mask pattern on the semiconductor substrate to define the first recess using photolithography, a photoresist reflow process, a spacer masking process, and/or a chemical adhesion process; and
etching the semiconductor substrate using the first mask pattern as an etch mask.

7. A method according to claim 6 wherein forming a sacrificial structure comprises epitaxially growing the sacrificial structure using the first mask pattern as an epitaxial mask to prevent epi-growth beneath the mask.

8. A method according to claim 5 wherein the sacrificial pattern comprises a crystalline material having an etching selectivity with respect to the semiconductor substrate and the epitaxial semiconductor layer.

9. A method according to claim 5 wherein the semiconductor substrate and the epitaxial semiconductor layer comprise silicon and the sacrificial structure comprises silicon germanium.

10. A method according to claim 5 wherein forming an epitaxial semiconductor layer comprises epitaxially growing a silicon layer having a crystalline structure equivalent to that of the substrate on the substrate and on the sacrificial structure.

11. A method according to claim 5 wherein patterning the epitaxial semiconductor layer and the semiconductor substrate to form a second recess further comprises:
forming a second mask pattern on the semiconductor substrate including the epitaxial semiconductor layer; and
etching the epitaxial semiconductor layer and the semiconductor substrate using the second mask pattern as an etch mask, wherein the second mask pattern crosses over the sacrificial structure.

12. A method according to claim 5 further comprising:
forming a gate insulation layer on the epitaxial semiconductor layer above the device isolation layer;
forming a gate pattern on the gate insulation layer to cross over a central portion of the epitaxial semiconductor layer; and
forming source/drain regions in the epitaxial semiconductor layer on both sides of the gate pattern.

13. A method according to claim 12 wherein the first recess is formed to contact a lateral surface of the source/drain region.

14. A method of forming a MOSFET comprising:
forming a first mask pattern in a predetermined region of a semiconductor substrate having a crystalline structure;
forming a first recess in the semiconductor substrate using the first mask pattern as an etch mask;
epitaxially growing a crystalline sacrificial structure in the first recess using the first mask pattern to prevent epitaxial growth beneath the first mask pattern;
removing the first mask pattern to expose an upper surface of the semiconductor substrate;
epitaxially growing a semiconductor layer on an upper surface of the sacrificial structure and the semiconductor substrate;
patterning the epitaxial semiconductor layer and the semiconductor substrate to form a second trench exposing a lateral surface of the sacrificial structure;
removing the exposed sacrificial structure to form a void in the first recess;
forming a device isolation layer in the void;
forming a gate insulation layer on the epitaxial semiconductor layer;
forming a gate pattern on the gate insulation layer to cross over a central portion of the epitaxial semiconductor layer; and
forming source/drain regions in the epitaxial semiconductor layer on both sides of the gate pattern.

15. A method of forming a Metal-Oxide-Semiconductor Field-Effect-Transistor (MOSFET) comprising:
forming a recess in an upper surface of a substrate;
forming a sacrificial crystalline structure filling the recess;
growing an epitaxial semiconductor layer on an upper surface of the sacrificial crystalline structure and on the substrate to form a buried sacrificial structure including in the recess wherein an upper surface of the buried sacrificial structure is above a lower surface of source/drain regions formed in the substrate;
removing the buried sacrificial structure to form a void in place of the buried sacrificial structure; and
forming a device isolation layer in the void, wherein forming a device isolation layer in the void comprises:
forming the device isolation layer adjacent to a source region and/or a drain region; and
avoiding forming the device isolation layer beneath a central portion of a channel region in the MOSFET.

* * * * *